United States Patent
Inoue et al.

(10) Patent No.: US 10,483,125 B2
(45) Date of Patent: Nov. 19, 2019

(54) SEMICONDUCTOR DEVICE AND METHOD FOR MANUFACTURING SAME

(71) Applicant: TOWERJAZZ PANASONIC SEMICONDUCTOR CO., LTD., Uozu, Toyama (JP)

(72) Inventors: Yuka Inoue, Toyama (JP); Mitsunori Fukura, Kyoto (JP); Nobuyoshi Takahashi, Toyama (JP); Masahiro Oda, Hyogo (JP); Hisashi Yano, Kyoto (JP); Yutaka Ito, Hyogo (JP); Yasunori Morinaga, Toyama (JP)

(73) Assignee: TOWERJAZZ PANASONIC SEMICONDUCTOR CO., LTD., Toyama (JP)

( * ) Notice: Subject to any disclaimer, the term of this patent is extended or adjusted under 35 U.S.C. 154(b) by 0 days.

(21) Appl. No.: 16/114,303

(22) Filed: Aug. 28, 2018

(65) Prior Publication Data
US 2018/0366342 A1  Dec. 20, 2018

Related U.S. Application Data

(63) Continuation of application No. PCT/JP2017/004961, filed on Feb. 10, 2017.

(51) Int. Cl.
*H01L 21/00* (2006.01)
*H01L 21/3205* (2006.01)
(Continued)

(52) U.S. Cl.
CPC .... *H01L 21/3205* (2013.01); *H01L 21/76802* (2013.01); *H01L 21/76808* (2013.01);
(Continued)

(58) Field of Classification Search
CPC ................ H01L 21/3205; H01L 23/12; H01L 21/76898; H01L 21/76808;
(Continued)

(56) References Cited

U.S. PATENT DOCUMENTS

| 2004/0201043 | A1* | 10/2004 | Mao | H01L 21/76802 257/208 |
| 2009/0134471 | A1* | 5/2009 | Chatterjee | H01L 21/76816 257/383 |
| 2015/0102497 | A1 | 4/2015 | Park | |

FOREIGN PATENT DOCUMENTS

| JP | 2012028696 A | 2/2012 |
| JP | 2013077711 A | 4/2013 |

(Continued)

OTHER PUBLICATIONS

International Search Report for corresponding application PCT/JP2017/004961 filed Feb. 10, 2017; dated Mar. 21, 2017.

*Primary Examiner* — Richard A Booth
(74) *Attorney, Agent, or Firm* — Cantor Colburn LLP

(57) ABSTRACT

A semiconductor device includes a first interlayer film formed on an upper surface of a substrate, a first metal wiring line, a second interlayer film, a second metal wiring line, a first via electrically connecting the first metal wiring line and the second metal wiring line, a landing pad embedded in an upper portion of the first interlayer film and penetrating the second interlayer film, and a second via penetrating the substrate and the first interlayer film from a back side of the substrate and connected to the landing pad. The lower surface position of the landing pad is different from that of the first metal wiring line.

8 Claims, 16 Drawing Sheets

(51) Int. Cl.
    *H01L 23/12*       (2006.01)
    *H01L 21/768*      (2006.01)
    *H01L 23/48*       (2006.01)
    *H01L 23/522*      (2006.01)

(52) U.S. Cl.
    CPC .. *H01L 21/76816* (2013.01); *H01L 21/76877* (2013.01); *H01L 21/76898* (2013.01); *H01L 23/12* (2013.01); *H01L 23/481* (2013.01); *H01L 23/522* (2013.01)

(58) Field of Classification Search
    CPC ......... H01L 21/76816; H01L 21/76802; H01L 21/76877; H01L 23/481; H01L 23/522
    See application file for complete search history.

(56) References Cited

FOREIGN PATENT DOCUMENTS

| | | |
|---|---|---|
| JP | 2014072296 A | 4/2014 |
| JP | 2015079961 A | 4/2015 |
| WO | 2009107742 A1 | 9/2009 |

\* cited by examiner

SEMICONDUCTOR DEVICE AND METHOD FOR MANUFACTURING SAME

CROSS-REFERENCE TO RELATED APPLICATIONS

This is a continuation of International Application No. PCT/JP2017/004961 filed on Feb. 10, 2017, which claims priority to Japanese Patent Application No. 2016-036622 filed on Feb. 29, 2016. The entire disclosures of these applications are incorporated by reference herein.

BACKGROUND

In recent years, development of the three-dimensional mounting technique of stacking chips in a longitudinal direction has advanced in association with device miniaturization and high integration, and the through-silicon-via (TSV) technique of penetrating a substrate to form electric connection in the vertical direction has been more important.

It has been demanded for such a TSV structure that the thickness of a TSV landing pad connected to a TSV is increased to prevent penetration of the TSV through the pad upon formation of the TSV. In response to such a demand, Japanese Unexamined Patent Publication No. 2015-79961 describes the technique of stacking two or more metal films to form a thick TSV landing pad.

SUMMARY

In the typical technique of stacking two or more metal layers to form the TSV landing pad in the TSV structure, connection failure between the landing pad and the TSV might occur.

Specifically, in the typical technique, after the first metal film has been formed, the first metal film is more affected by the etching step of forming the second metal film and subsequent metal films. For this reason, there is a probability that an affected portion of the first metal film is washed away by a cleansing step after the etching step, and therefore, a cavity is formed upon formation of the second metal film. When the cavity is formed between the first metal film and the second metal film as described above, poor electric properties might be exhibited at a connection portion of the TSV landing pad with the TSV, and reliability might be lowered.

Hereinafter, a semiconductor device capable of preventing penetration of a TSV through a landing pad upon formation of the TSV and ensuring favorable electric connection between the TSV and the landing pad will be described.

The semiconductor device disclosed in the present specification includes a substrate provided with a first region and a second region, and a first interlayer film formed on an upper surface of the substrate. The semiconductor device further includes a first metal wiring line embedded in an upper portion of the first interlayer film in the first region, a second interlayer film formed on the first interlayer film and the first metal wiring line, a second metal wiring line embedded in an upper portion of the second interlayer film in the first region, and a first via penetrating the second interlayer film and electrically connecting the first metal wiring line and the second metal wiring line. The semiconductor device further includes a landing pad embedded in the upper portion of the first interlayer film and penetrating the second interlayer film in the second region, and a second via penetrating the substrate and the first interlayer film from a back side of the substrate and connected to the landing pad in the second region. The lower surface position of the landing pad is different from that of the first metal wiring line.

According to the semiconductor device and the method for manufacturing the semiconductor device as disclosed in the present specification, penetration of the TSV through the landing pad upon formation of the TSV can be prevented, and favorable electric connection between the TSV and the landing pad can be realized.

DETAILED DESCRIPTION

Hereinafter, embodiments of the present disclosure will be described in detail with reference to the drawings.

First Embodiment

Method for Manufacturing Semiconductor Device

FIGS. 1A to 1C, FIGS. 2A to 2C, FIGS. 3A to 3C, and FIGS. 4A to 4D are sectional views for describing the method for manufacturing a semiconductor device according to a first embodiment. In these figures, a left side is an element formation region 20 (a first region), and a right side is a pad formation region 30 (a second region). Hereinafter, the method for manufacturing the semiconductor device will be described.

Figure 1A:
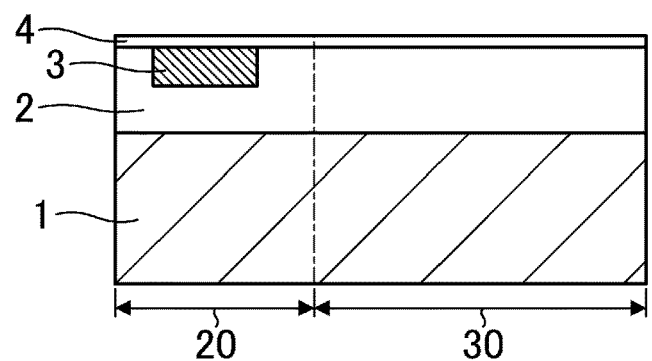
FIG. 1A is a sectional view for describing the method for manufacturing a semiconductor device according to a first embodiment.

First, as illustrated in FIG. 1A, a first interlayer film 2 made of an insulator such as silicon oxide ($SiO_2$) is, by a chemical vapor deposition (CVD) method etc., formed on an upper surface of a substrate 1 provided with the element formation region 20 and the pad formation region 30. Subsequently, a wiring groove is formed at an upper portion of the first interlayer film 2 by well-known lithography and etching. Next, after the wiring groove has been filled with metal such as copper by a plating method, extra metal is removed by a chemical mechanical polishing (CMP) method etc. In this manner, a first metal wiring line 3 embedded in the wiring groove and having a thickness of about 120 nm is formed. The thickness of the first interlayer film 2 in this state is 400 nm, for example.

Meanwhile, in the pad formation region 30, no metal layer equivalent to the first metal wiring line 3 is formed.

Subsequently, a first liner film 4 made of silicon carbide (SiC) etc. and having a thickness of 60 nm is formed by a well-known method on the first metal wiring line 3 and the first interlayer film 2.

Figure 1B:
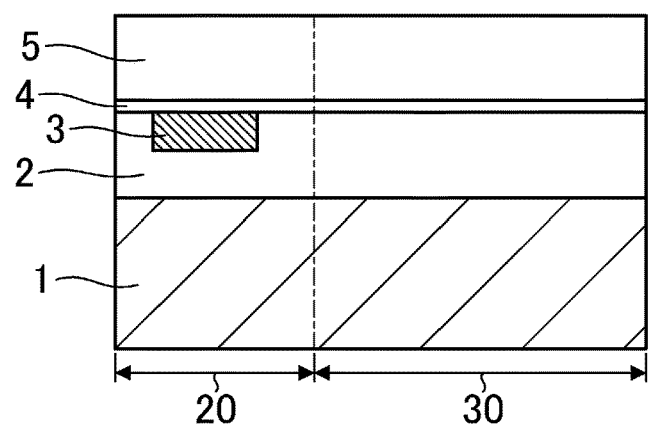
FIG. 1B is a sectional view for describing the method for manufacturing the semiconductor device according to the first embodiment.

Next, as illustrated in FIG. 1B, a second interlayer film 5 made of silicon oxide and having a thickness of 300 nm is formed on the first interlayer film 2 and the first metal wiring line 3 with the first liner film 4 being interposed between the second interlayer film 5 and the first interlayer film 2 or the first metal wiring line 3.

Figure 1C:
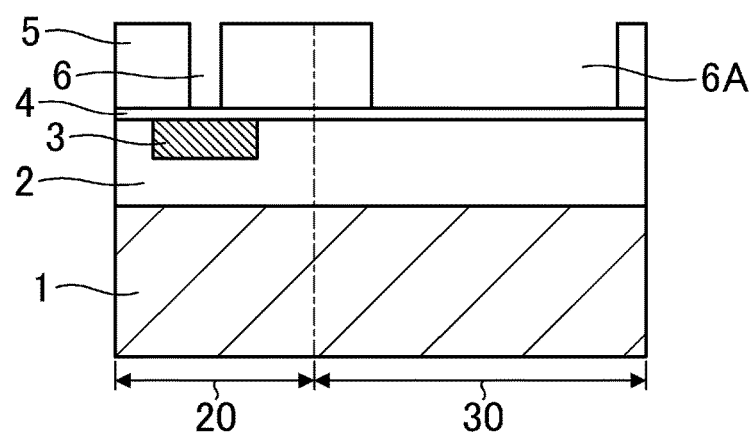
FIG. 1C is a sectional view for describing the method for manufacturing the semiconductor device according to the first embodiment.

Subsequently, as illustrated in FIG. 1C, a via hole 6 penetrating the second interlayer film 5 is formed above the first metal wiring line 3 in the element formation region 20 by lithography and etching. At the same time as formation of the via hole 6, a pad hole 6A penetrating the second interlayer film 5 is formed in the pad formation region 30. The diameter of the via hole 6 is about 100 nm, and the diameter of the pad hole 6A is about 70 μm. The via hole 6 and the pad hole 6A can be formed by etching using the same mask (not shown). Such etching is stopped at the first liner film 4.

Figure 2A:
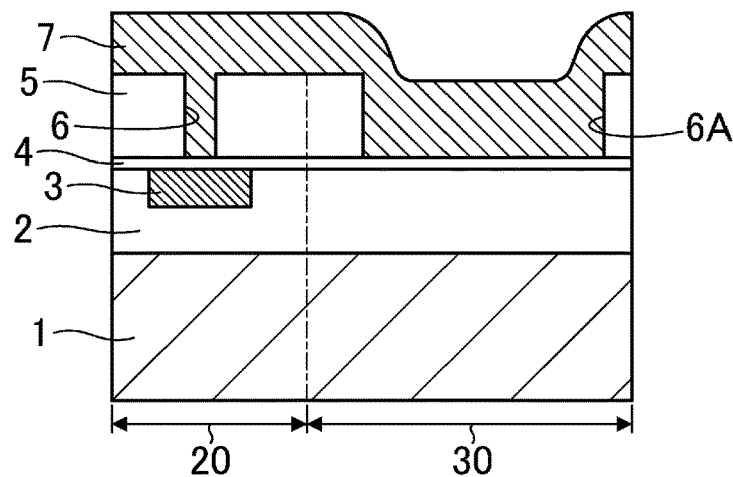
FIG. 2A is a sectional view for describing the method for manufacturing the semiconductor device according to the first embodiment.

Next, as illustrated in FIG. 2A, a resist 7 having a thickness of about 300 nm is formed on the substrate. The opening area of the via hole 6 in the element formation region 20 is small. For this reason, the via hole 6 is fully filled with the resist 7, and the resist 7 is, including the resist in the via hole 6, formed with a thickness of 600 nm. On the other hand, the planar area of the pad hole 6A formed in the pad formation region 30 is larger than the via hole 6. Thus, the thickness of the resist 7 on the pad hole 6A is about 300 nm, and is thinner than the thickness of the resist 7 on the via hole 6.

Figure 2B:
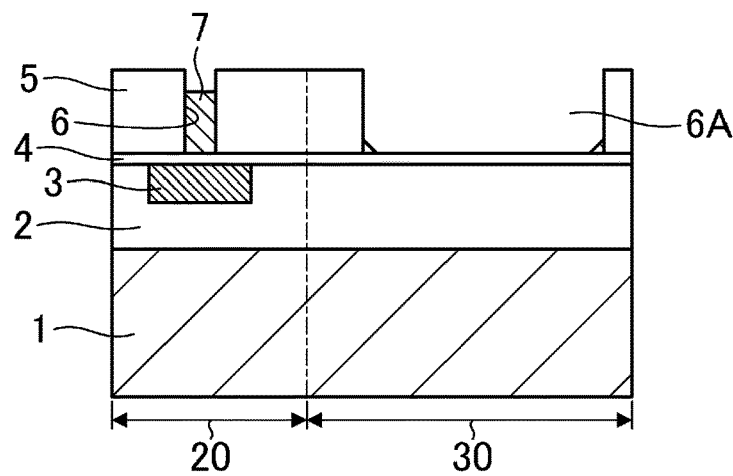
FIG. 2B is a sectional view for describing the method for manufacturing the semiconductor device according to the first embodiment.

Next, as illustrated in FIG. 2B, the resist 7 is etched back such that a portion of the resist 7 on the second interlayer film 5 and a portion of the resist 7 in the pad hole 6A are removed. At this step, the resist 7 remains in the via hole 6, but almost no resist 7 remains in the pad hole 6A.

Figure 2C:
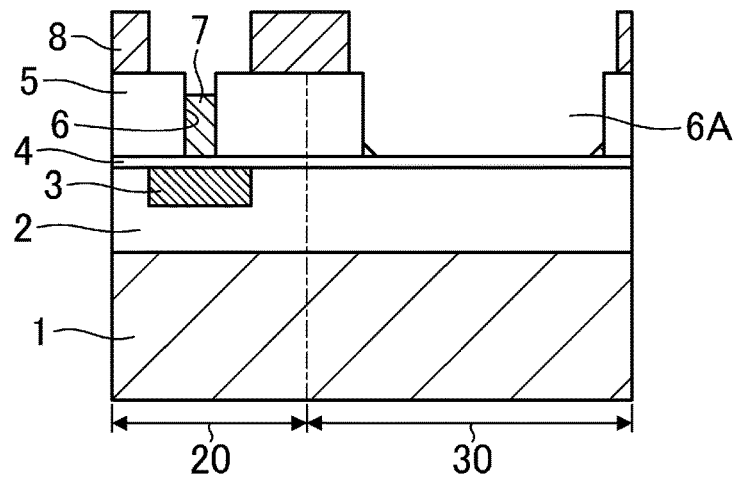
FIG. 2C is a sectional view for describing the method for manufacturing the semiconductor device according to the first embodiment.

Next, as illustrated in FIG. 2C, a wiring formation region opens in the element formation region 20 by lithography, and a resist 8 is formed in the pad formation region 30 such that a portion above the pad hole 6A opens. The opening provided above the pad hole 6A may have a larger planar area than that of the pad hole 6A.

Figure 3A:
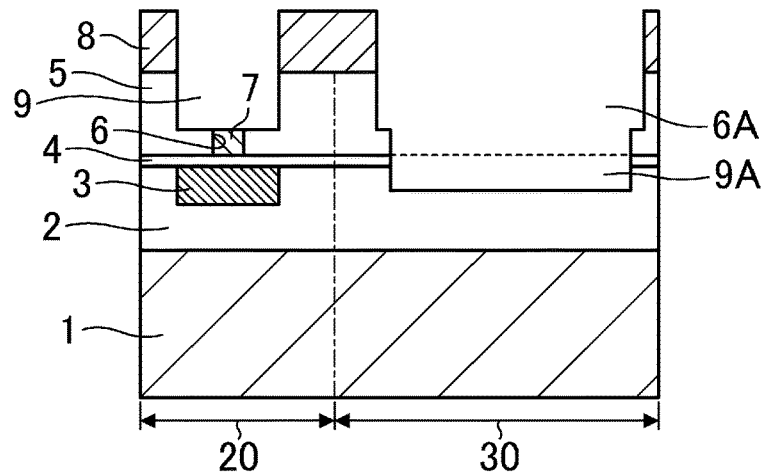
FIG. 3A is a sectional view for describing the method for manufacturing the semiconductor device according to the first embodiment.

Subsequently, as illustrated in FIG. 3A, the second interlayer film 5 is etched using the resist 8, and in this manner, a wiring groove 9 is formed in the element formation region 20. The depth of the wiring groove 9 is about 180 nm. Since the resist 7 remains in the via hole 6, the first liner film 4 is not etched in the region provided with the via hole 6.

At the same time as formation of the wiring groove 9, the first liner film 4 and the upper portion of the first interlayer film 2 are, in the pad formation region 30, removed to form a pad recessed portion 9A. The amount of etching in the pad recessed portion 9A is about 120 to 150 nm.

Figure 3B:
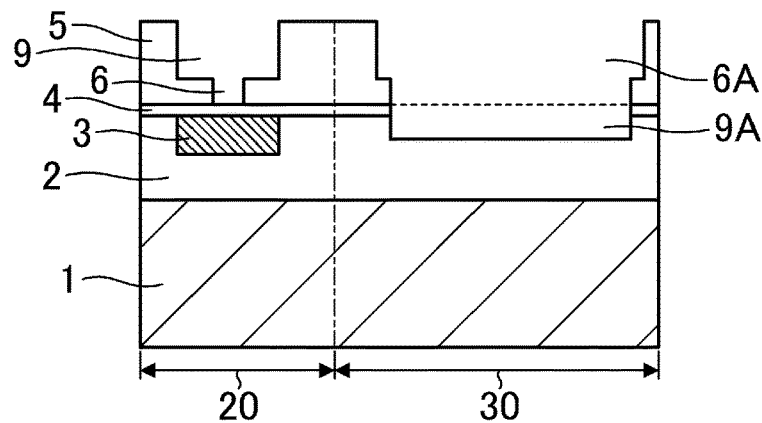
FIG. 3B is a sectional view for describing the method for manufacturing the semiconductor device according to the first embodiment.

Next, as illustrated in FIG. 3B, the resists 7, 8 are removed by cleansing.

Figure 3C:
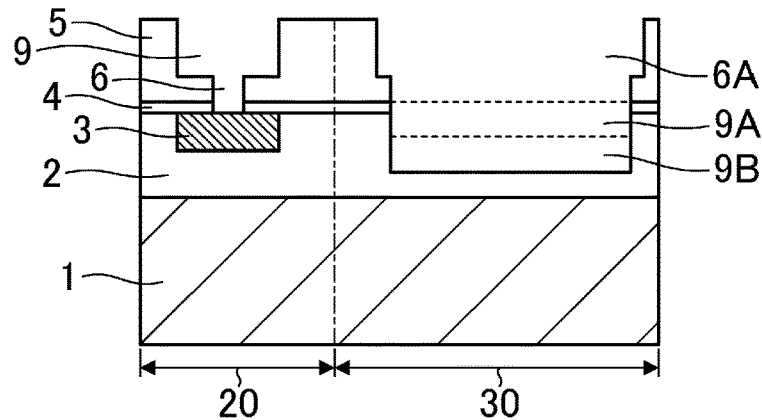
FIG. 3C is a sectional view for describing the method for manufacturing the semiconductor device according to the first embodiment.

Subsequently, as illustrated in FIG. 3C, a portion of the first liner film 4 exposed in the via hole 6 is removed by etching. At the same time as removal of the first liner film 4, part of the first interlayer film 2 is, in the pad formation region 30, removed to form a pad recessed portion 9B. The depth of the pad recessed portion 9B is about 70 nm.

Figure 4A:
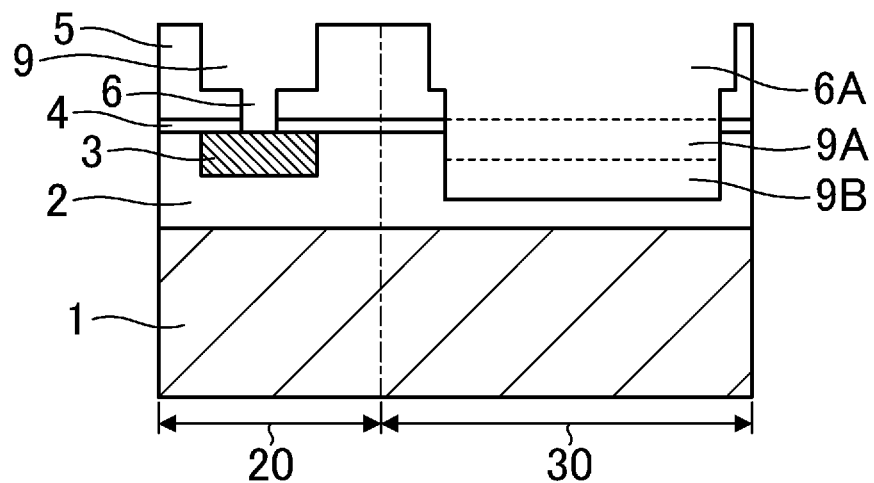
FIG. 4A is a sectional view for describing the method for manufacturing the semiconductor device according to the first embodiment.

Next, as illustrated in FIG. 4A, a reactive product due to etching is removed by cleansing. The shape of the semiconductor device is not changed due to cleansing at this step.

Figure 4B:
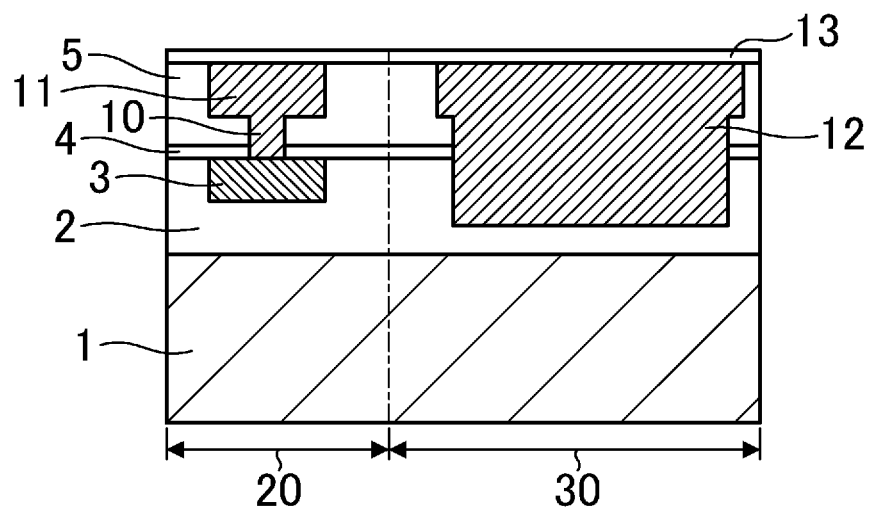
FIG. 4B is a sectional view for describing the method for manufacturing the semiconductor device according to the first embodiment.

Next, as illustrated in FIG. 4B, after the via hole 6 and the wiring groove 9 in the element formation region 20 and the pad hole 6A and the pad recessed portions 9A, 9B in the pad formation region 30 have been filled with copper by the plating method, extra copper is removed by the CMP method. In this manner, a first via 10 is formed in the via hole 6, and a second metal wiring line 11 is formed in the wiring groove 9. Moreover, a landing pad 12 is formed in the pad recessed portions 9A, 9B and the pad hole 6A. In this state, the lower surface position of the landing pad 12 is deeper than that of the first metal wiring line 3.

The height of the first via 10 is about 110 nm, and the height of the second metal wiring line 11 is about 120 nm. Moreover, the height (the thickness) of the landing pad 12 is about 360 nm to 390 nm. Thereafter, a second liner film 13 having a thickness of 60 nm and made of silicon carbide is formed on the second interlayer film 5, the second metal wiring line 11, and the landing pad 12.

Figure 4C:
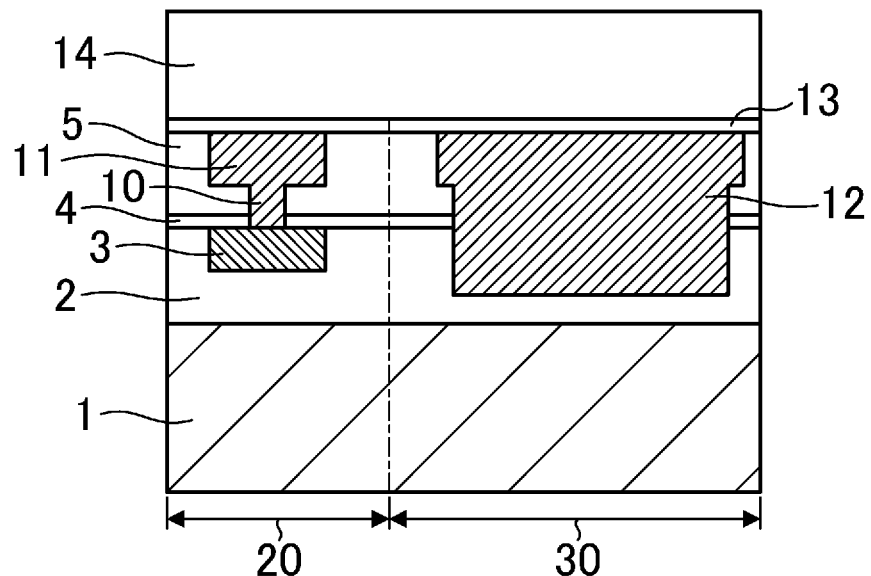
FIG. 4C is a sectional view for describing the method for manufacturing the semiconductor device according to the first embodiment.

Next, as illustrated in FIG. 4C, a passivation film 14 made of silicon nitride and having a thickness of 1000 nm is formed by the well-known CVD method etc. on the second liner film 13. As described above, processing of an upper side of the substrate 1 is completed tentatively.

Figure 4D:
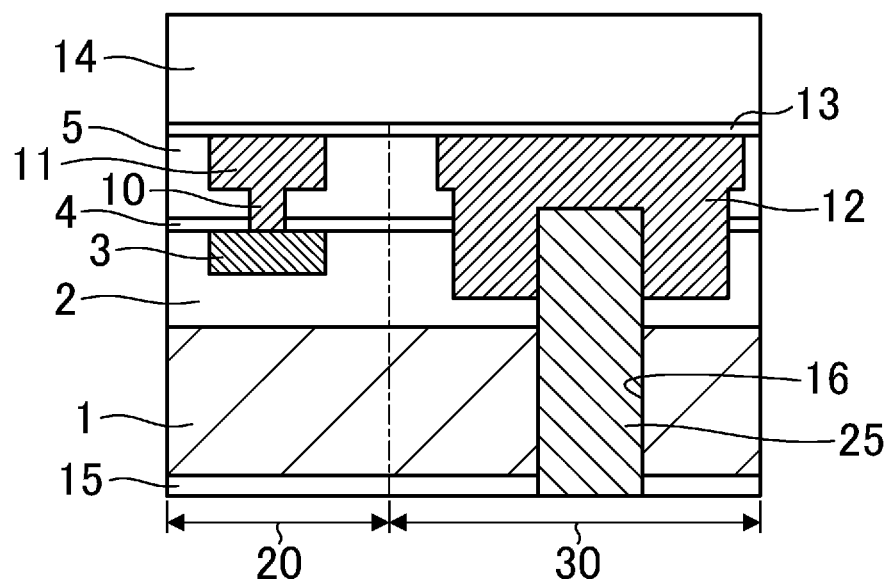
FIG. 4D is a sectional view for describing the method for manufacturing the semiconductor device according to the first embodiment.

Next, as illustrated in FIG. 4D, the substrate 1 is shaved down from a back side such that the thickness of the substrate 1 reaches about 300 to 400 μm. Subsequently, an insulating film 15 covering the element formation region 20 and formed from a silicon oxide film etc. is formed on a back surface of the substrate 1. Thereafter, the insulating film 15 and the substrate 1 are etched from the back side by lithography and the etching method. In this state, etching is performed until reaching part of the landing pad 12, thereby forming a via hole 16. Subsequently, after the via hole 16 has been filled with copper by the well-known plating method etc., extra copper is removed by CMP. In this manner, a TSV (a second via) 25 penetrating the substrate 1 and connected to the landing pad 12 is formed. The metal formed in the via hole 16 may be, for example, tungsten (W) or aluminum (Al), or the via hole 16 is not necessarily fully filled with the metal. By the above-described steps, the semiconductor device of the present embodiment can be produced.

Next, reasons for forming the landing pad 12 by the above-described method will be described in comparison with a manufacturing method according to a reference example.

FIGS. 5A to 5C, FIGS. 6A to 6C, FIGS. 7A to 7C, and FIGS. 8A to 8D are sectional views for describing the method for manufacturing a semiconductor device according to the reference example.

Figure 5A:
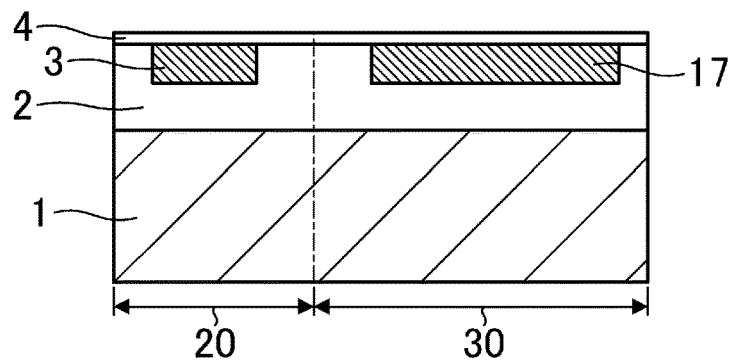
FIG. 5A is a sectional view for describing the method for manufacturing a semiconductor device according to a reference example.

In the present reference example, as illustrated in FIG. 5A, the first interlayer film 2 made of an insulator such as silicon oxide is formed on the upper surface of the substrate 1 provided with the element formation region 20 and the pad formation region 30. Subsequently, the wiring groove is formed at the upper portion of the first interlayer film 2 by well-known lithography and etching. In this state, the recessed portion having the same depth as that of the wiring groove in the element formation region 20 is also formed in the pad formation region 30.

Subsequently, copper is deposited on the substrate by the plating method, and thereafter, extra copper is removed by the CMP method. In this manner, the first metal wiring line 3 is formed in the element formation region 20, and a metal film 17 is formed in the pad formation region 30.

Figure 5B:
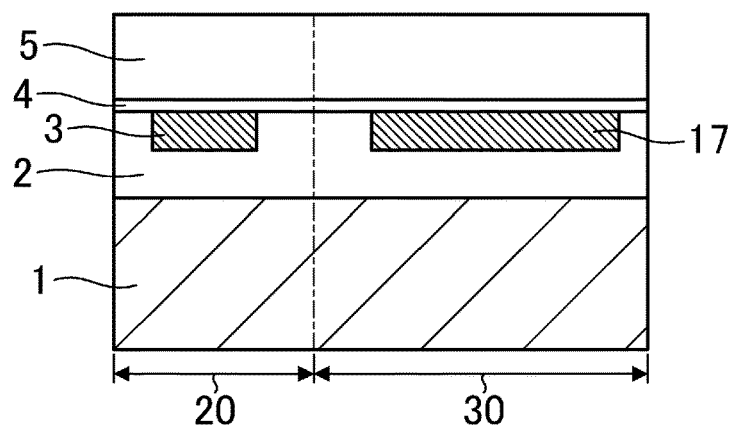
FIG. 5B is a sectional view for describing the method for manufacturing the semiconductor device according to the reference example.
Figure 5C:
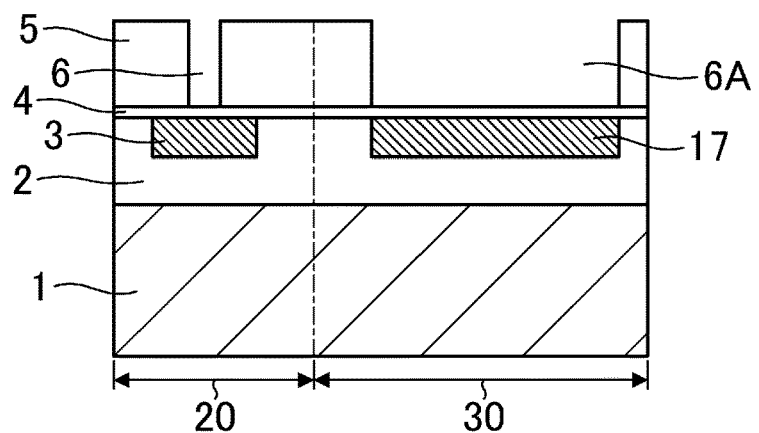
FIG. 5C is a sectional view for describing the method for manufacturing the semiconductor device according to the reference example.

Next, as illustrated in FIG. 5B, the second interlayer film 5 made of silicon oxide and having a thickness of 300 nm is formed on the first interlayer film 2 and the first metal wiring line 3 with the first liner film 4 being interposed between the second interlayer film 5 and the first interlayer film 2 or the first metal wiring line 3. Subsequently, as illustrated in FIG. 5C, the via hole 6 penetrating the second interlayer film 5 is formed in the element formation region 20, and the pad hole 6A is formed above the metal film 17 in the pad formation region 30.

Figure 6A:
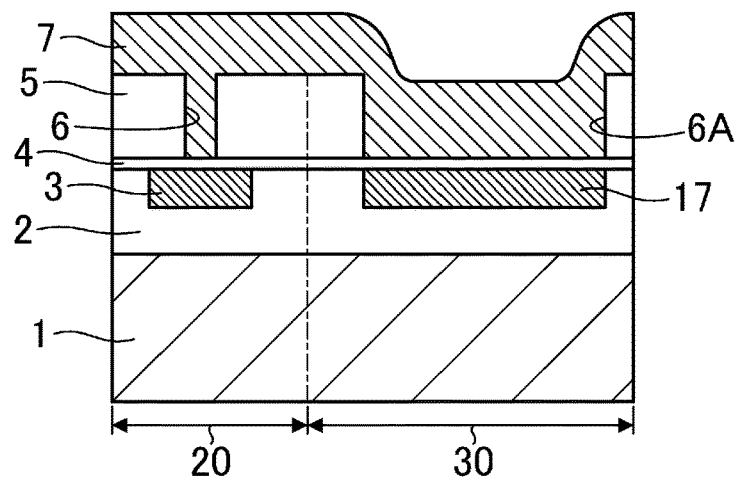
FIG. 6A is a sectional view for describing the method for manufacturing the semiconductor device according to the reference example.
Figure 6B:
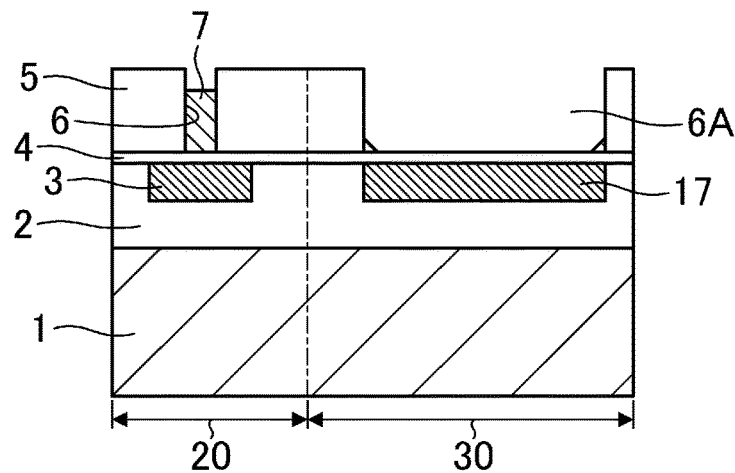
FIG. 6B is a sectional view for describing the method for manufacturing the semiconductor device according to the reference example.

Next, as illustrated in FIG. 6A, the resist 7 having a thickness of about 300 nm is formed on the substrate. The via hole 6 and the pad hole 6A are filled with the resist 7. Next, as illustrated in FIG. 6B, the resist 7 is etched back such that the portion of the resist 7 on the second interlayer film 5 and the portion of the resist 7 in the pad hole 6A are removed.

Figure 6C:
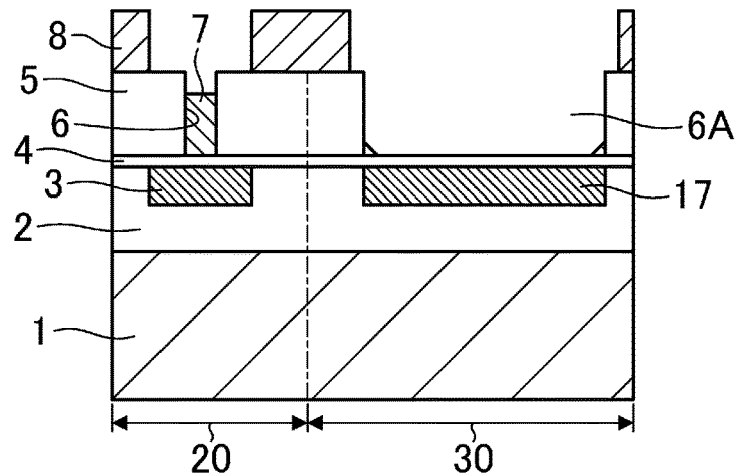
FIG. 6C is a sectional view for describing the method for manufacturing the semiconductor device according to the reference example.
Figure 7A:
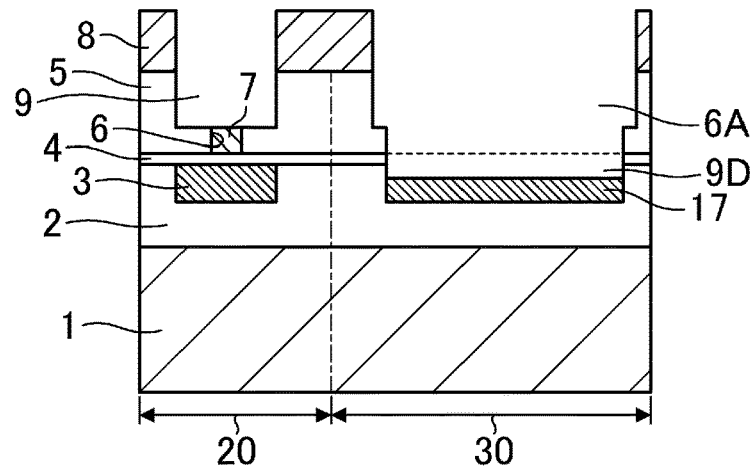
FIG. 7A is a sectional view for describing the method for manufacturing the semiconductor device according to the reference example.

Next, as illustrated in FIG. 6C, the resist 8 for wiring formation is formed by lithography. Subsequently, as illustrated in FIG. 7A, the wiring groove 9 is formed in the element formation region 20. In this state, the first liner film 4 exposed in the pad hole 6A is removed in the pad formation region 30, and an upper portion of the metal film 17 is also removed. In this manner, a pad recessed portion 9D is formed. The etching rate of copper forming the metal film 17 is slower than that of the second interlayer film 5, and therefore, the depth of the pad recessed portion 9D is shallower than that of the pad recessed portion 9A (see FIG.

3A) in the semiconductor device of the present embodiment. Note that at this step, the metal film 17 is greatly affected due to etching.

Figure 7B:
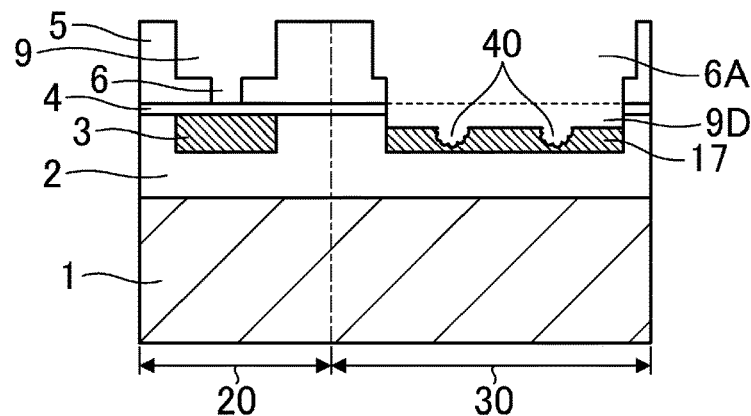
FIG. 7B is a sectional view for describing the method for manufacturing the semiconductor device according to the reference example.

Next, as illustrated in FIG. 7B, when the resist 7 is removed by cleansing, copper flows out of the metal film 17 affected due to etching, and defects 40 are formed.

Figure 7C:
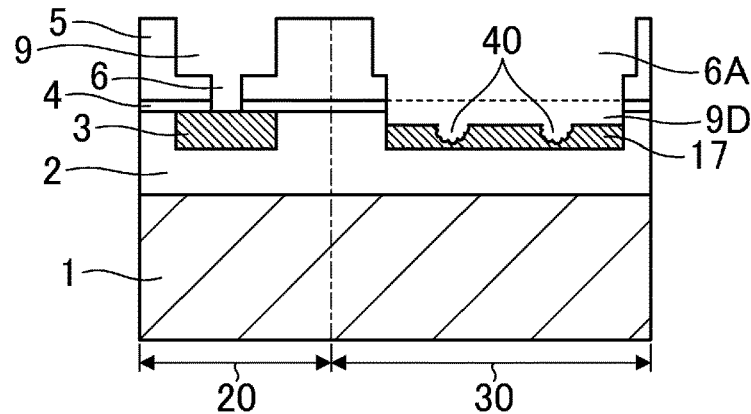
FIG. 7C is a sectional view for describing the method for manufacturing the semiconductor device according to the reference example.
Figure 8A:
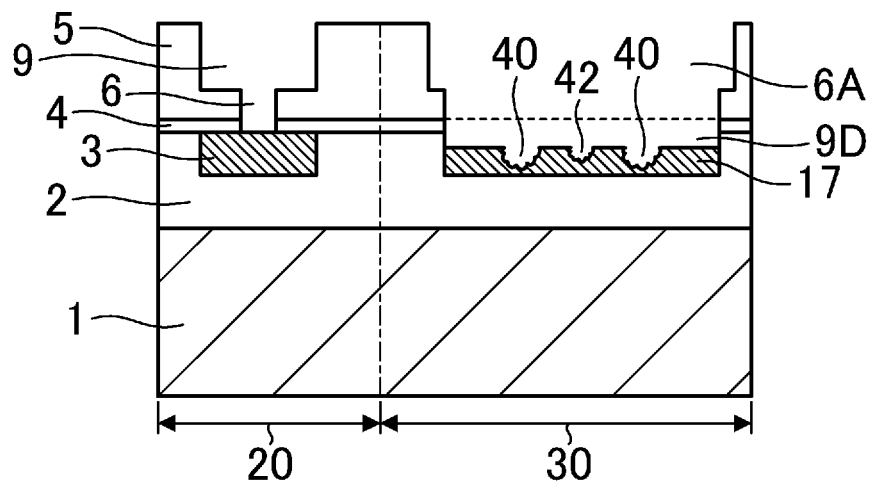
FIG. 8A is a sectional view for describing the method for manufacturing the semiconductor device according to the reference example.

Next, as illustrated in FIG. 7C, the first liner film 4 exposed in the via hole 6 is removed in the element formation region 20. At this step, the metal film 17 is also affected. Subsequently, as illustrated in FIG. 8A, the reactive product due to etching is removed by cleansing. In this state, a defect 42 is caused at the metal film 17 due to damage of the metal film 17 caused by etching.

Figure 8B:
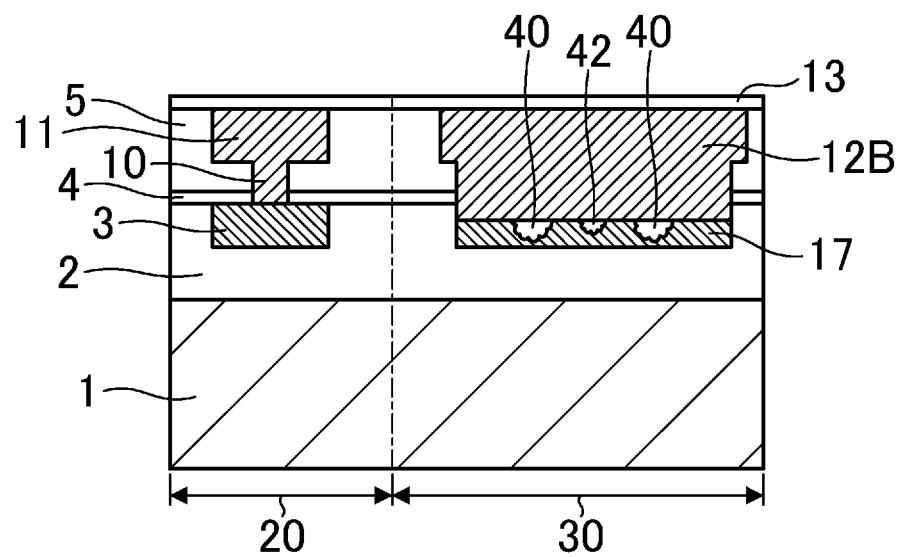
FIG. 8B is a sectional view for describing the method for manufacturing the semiconductor device according to the reference example.

Next, as illustrated in FIG. 8B, after the via hole 6 and the wiring groove 9 in the element formation region 20 and the pad hole 6A and the pad recessed portion 9D in the pad formation region 30 have been filled with copper by the plating method, extra copper is removed by the CMP method. In this manner, the first via 10 is formed in the via hole 6, and the second metal wiring line 11 is formed in the wiring groove 9. At this step, the pad hole 6A and the pad recessed portion 9D are filled with copper, and therefore, a landing pad 12B including such copper and the metal film 17 is formed. Thus, the lower surface position of the landing pad 12B produced by the method according to the reference example is equal to that of the first metal wiring line 3.

In the method according to the reference example, the defects 40, 42 caused at the metal film 17 during the manufacturing step remain as cavities without the defects 40, 42 being filled.

Subsequently, the second liner film 13 having a thickness of 60 nm and made of silicon carbide is formed on the second interlayer film 5, the second metal wiring line 11, and the landing pad 12B.

Figure 8C:
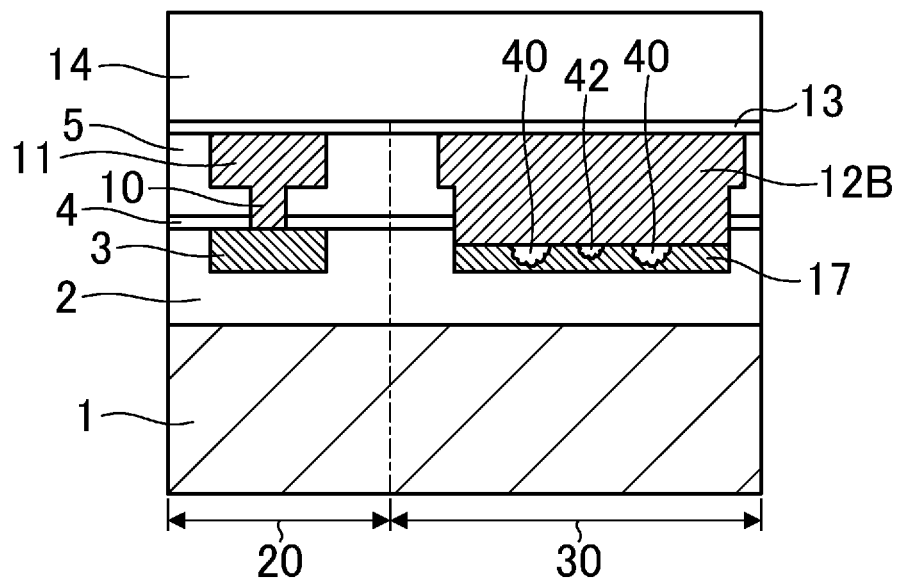
FIG. 8C is a sectional view for describing the method for manufacturing the semiconductor device according to the reference example.
Figure 8D:
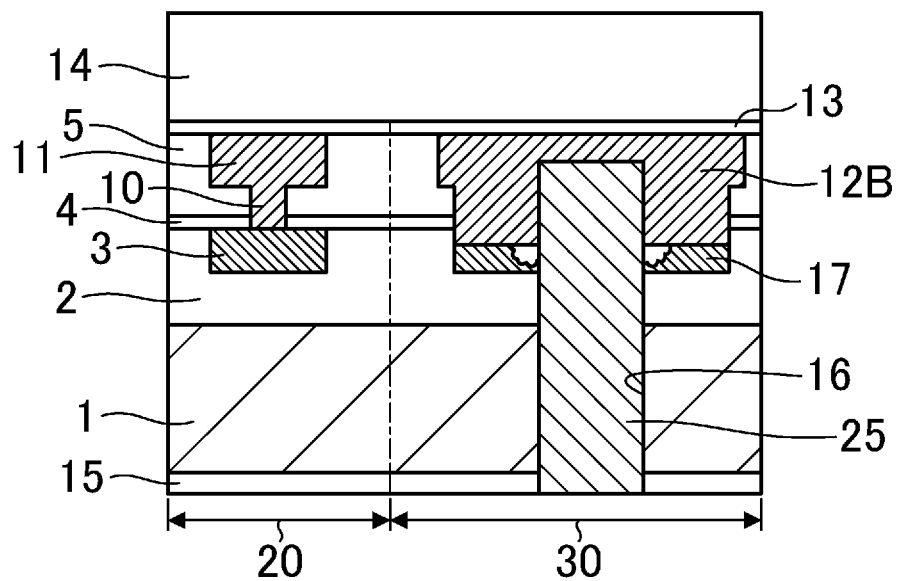
FIG. 8D is a sectional view for describing the method for manufacturing the semiconductor device according to the reference example.

Thereafter, as illustrated in FIG. 8C, the passivation film 14 made of silicon nitride and having a thickness of 1000 nm is formed by the well-known CVD method etc. on the second liner film 13. Next, as illustrated in FIG. 8D, the substrate 1 is shaved down from the back side such that the thickness of the substrate 1 reaches about 300 to 400 µm. Subsequently, the insulating film 15 is formed on the back surface of the substrate 1. Subsequently, the insulating film 15 and the substrate 1 are etched from the back side by lithography and the etching method. In this state, etching is performed until reaching part of the landing pad 12B, thereby forming the via hole 16. Subsequently, after the via hole 16 has been filled with copper by the well-known plating method etc., extra copper is removed by CMP. In this manner, the TSV (the second via) 25 penetrating the substrate 1 and connected to the landing pad 12B is formed.

In the semiconductor device according to the reference example, the defects 40, 42 are caused in the landing pad 12B, and for this reason, connection failure between the landing pad 12B and the TSV 25 might occur.

On the other hand, in the semiconductor device of the present embodiment, no damage due to etching is on the landing pad 12, and therefore, no connection failure between the landing pad 12 and the TSV 25 occurs. Moreover, in the semiconductor device of the present embodiment, the lower surface position of the landing pad 12 can be lower than that of the first metal wiring line 3, and therefore, the landing pad 12 can be formed thicker than that of the semiconductor device according to the reference example. Upon formation of the via hole 16, penetration of the via hole 16 through the landing pad 12 is less caused.

Moreover, in the method of the present embodiment, formation of the recessed portion for forming the landing pad 12 can be performed at the same time as formation of the wiring groove 9 or the via hole 6, and formation of the copper film for the landing pad 12 can be performed at the same time as formation of the second metal wiring line 11 and the first via 10. Thus, the landing pad 12 can be formed without an increase in steps.

Configuration of Semiconductor Device

The semiconductor device of the present embodiment produced by the above-described method includes, as illustrated in FIG. 4D, the substrate 1 provided with the element formation region (the first region) 20 and the pad formation region (the second region) 30, the first interlayer film 2 formed on the upper surface of the substrate 1, the first metal wiring line 3 embedded in the upper portion of the first interlayer film 2 in the element formation region 20, the second interlayer film 5 formed on the first interlayer film 2 and the first metal wiring line 3, the second metal wiring line 11 embedded in the upper portion of the second interlayer film 5 in the element formation region 20, the first via 10 penetrating the second interlayer film 5 and electrically connecting the first metal wiring line 3 and the second metal wiring line 11, the landing pad 12 embedded in the upper portion of the first interlayer film 2 and penetrating the second interlayer film 5 in the pad formation region 30, and the TSV (the second via) 25 penetrating the substrate 1 and the first interlayer film 2 from the back side of the substrate 1 and connected to the landing pad 12 in the pad formation region 30. The semiconductor device of the present embodiment further includes the second liner film 13 formed on the second metal wiring line 11 and the landing pad 12, and the passivation film 14 formed on the second liner film 13.

The lower surface position of the landing pad 12 is different from that of the first metal wiring line 3, and is lower than that of the first metal wiring line 3.

The substrate 1 may be made of a semiconductor such as silicon, but is not limited to the semiconductor. For example, the first interlayer film 2 and the second interlayer film 5 are formed from, e.g., an insulating film of silicon oxide. The first interlayer film 2 and the second interlayer film 5 may be made of other insulators than silicon oxide, or may be a well-known low-k film.

The landing pad 12, the first metal wiring line 3, and the second metal wiring line 11 may be made of, e.g., copper or alloy containing copper as a main component, or may be made of other conductive substances than copper. The landing pad 12 may be made of the same material as those of the second metal wiring line 11 and the first via 10.

The first metal wiring line 3, the second metal wiring line 11, the first via, the landing pad 12, and the TSV 25 may be each made only of copper etc., but may each include two layers of a barrier metal layer thinly formed along the wiring groove or an inner surface of the recessed surface and a metal layer of copper etc. or may each have other configurations than above.

In the semiconductor device of the present embodiment, the thickness of the landing pad 12 is thicker than the total value of the height of the first metal wiring line 3, the height of the first via 10, and the height of the second metal wiring line 11.

Moreover, in the semiconductor device of the present embodiment, the example where the double-layer metal wiring layer is provided has been described, but a metal wiring line with more layers may be provided. In this case, the landing pad 12 may be provided by means of the step of forming two layers of metal wiring lines adjacent to each other in an upper-to-lower direction, and may be formed thicker than the total height of at least one metal wiring line and a via connected thereto.

The thickness of the first interlayer film 2 may be about 400 nm, for example. Moreover, the diameter of the landing pad 12 may be about 70 µm, and the thickness of the landing pad 12 may be about 360 nm to 390 nm.

Second Embodiment

The method for manufacturing a semiconductor device according to a second embodiment of the present disclosure will be described.

FIGS. 9A to 9C and FIGS. 10A to 10C are sectional views for describing the method for manufacturing the semiconductor device according to the second embodiment. Steps until the step illustrated in FIG. 2B are the same between the method of the present embodiment and the method of the first embodiment. Thus, steps after the step illustrated in FIG. 2B will be described below.

Figure 9A:
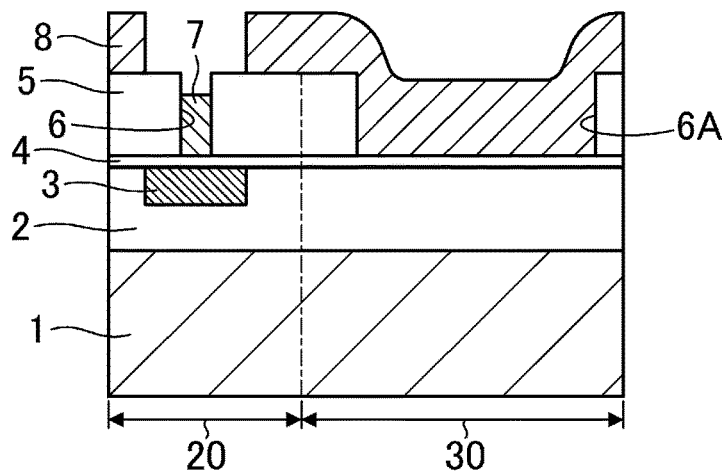
FIG. 9A is a sectional view for describing the method for manufacturing a semiconductor device according to a second embodiment.

As illustrated in FIG. 9A, a wiring formation region opens in an element formation region 20, and a resist 8 covering a pad hole 6A is formed in a pad formation region 30.

Figure 9B:
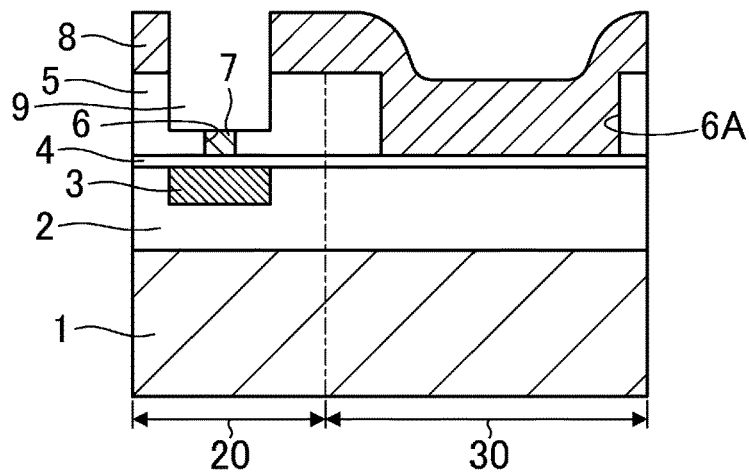
FIG. 9B is a sectional view for describing the method for manufacturing the semiconductor device according to the second embodiment.

Next, as illustrated in FIG. 9B, a second interlayer film 5 is etched using the resist 8 such that a wiring groove 9 is formed in the element formation region 20. In this state, a first liner film 4 is not etched in the pad formation region 30.

Figure 9C:
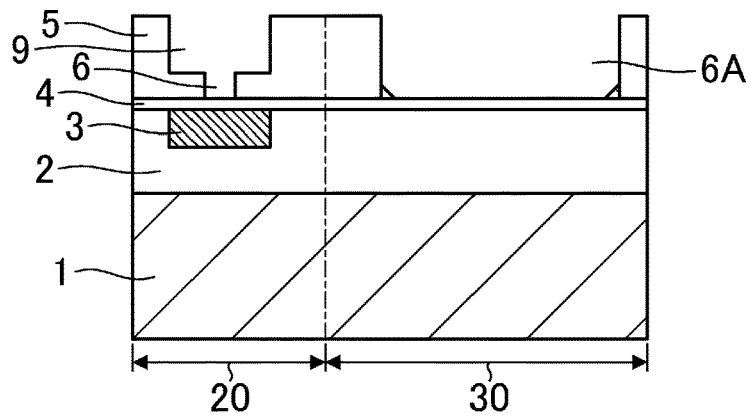
FIG. 9C is a sectional view for describing the method for manufacturing the semiconductor device according to the second embodiment.

Next, as illustrated in FIG. 9C, the resists 7, 8 are removed by cleansing.

Figure 10A:
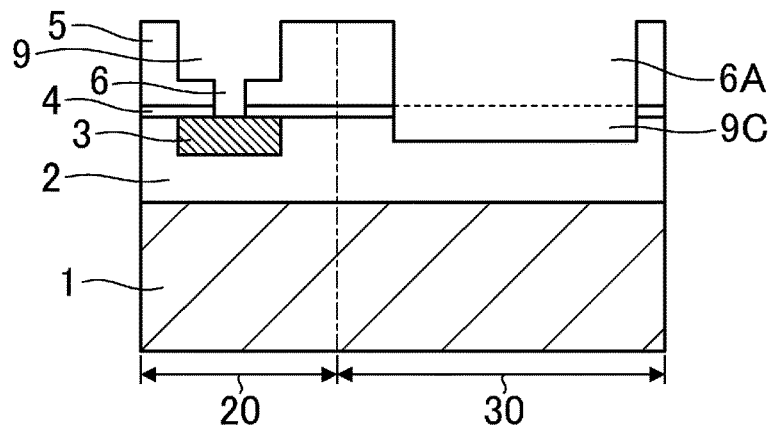
FIG. 10A is a sectional view for describing the method for manufacturing the semiconductor device according to the second embodiment.

Next, as illustrated in FIG. 10A, a portion of the first liner film 4 exposed in a via hole 6 is removed by etching. Moreover, at the same time as removal of the first liner film 4, part of the first liner film 4 and part of a first interlayer film 2 are removed in the pad formation region 30, and a pad recessed portion 9C is formed.

Figure 10B:
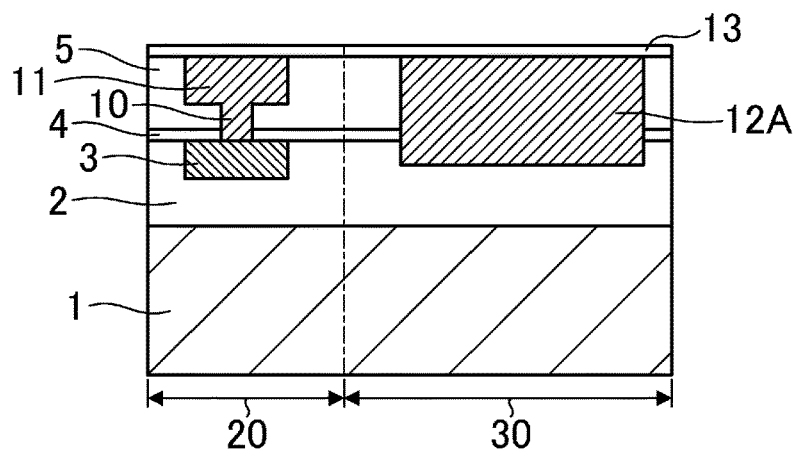
FIG. 10B is a sectional view for describing the method for manufacturing the semiconductor device according to the second embodiment.

Subsequently, as illustrated in FIG. 10B, a substrate is cleansed, and then, after the via hole 6 and the wiring groove 9 in the element formation region 20 and the pad hole 6A and the pad recessed portion 9C in the pad formation region 30 have been filled with copper by a plating method, extra copper is removed by a CMP method. In this manner, a first via 10 is formed in the via hole 6, and a second metal wiring line 11 is formed in the wiring groove 9. Moreover, a landing pad 12 is formed in the pad recessed portion 9C and the pad hole 6A. In this state, the lower surface position of the landing pad 12 is shallower than that of the first metal wiring line 3. The thickness of the landing pad 12 is about 240 nm.

Thereafter, a second liner film 13 having a thickness of 60 nm and made of silicon carbide is formed on the second interlayer film 5, the second metal wiring line 11, and the landing pad 12.

Figure 10C:
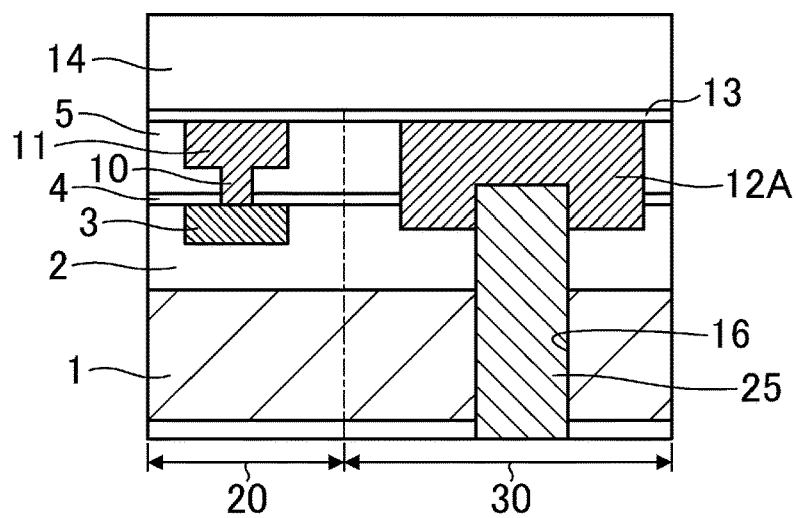
FIG. 10C is a sectional view for describing the method for manufacturing the semiconductor device according to the second embodiment.

Next, as illustrated in FIG. 10C, a passivation film 14 made of silicon nitride and having a thickness of 1000 nm is formed by a well-known CVD method etc. on the second liner film 13. Subsequently, the substrate 1 is shaved down from a back side such that the thickness of the substrate 1 reaches about 300 to 400 µm. Subsequently, an insulating film 15 is formed on a back surface of the substrate 1. Thereafter, the insulating film 15 and the substrate 1 are etched from the back side by lithography and an etching method. In this state, etching is performed until reaching part of the landing pad 12, thereby forming a via hole 16. Subsequently, after the via hole 16 has been filled with copper by the well-known plating method, extra copper is removed by CMP. In this manner, a TSV (a second via) 25 penetrating the substrate 1 and connected to the landing pad 12 is formed.

By the above-described method, the landing pad 12 is also formed from the metal film formed at once, and therefore, the metal film does not affected by etching. Thus, no defect is caused in the landing pad 12, and therefore, connection failure between the TSV 25 and the landing pad 12 is less caused.

Moreover, according to the method of the present embodiment, the thickness of the landing pad 12 can be thicker than the total value of the height of the first via 10 and the height of the second metal wiring line 11, and therefore, penetration of the TSV 25 through the landing pad 12 upon formation of the TSV 25 is less caused.

Other Embodiments

FIGS. 11A to 11C, FIGS. 12A to 12C, FIGS. 13A to 13C, and FIGS. 14A and 14B are sectional views for describing the method for manufacturing a semiconductor device according to other embodiments of the present disclosure.

The semiconductor device in the case of forming a via hole 6B having the same size as that of an element formation region 20 in a pad formation region 30 will be described herein.

Figure 11A:
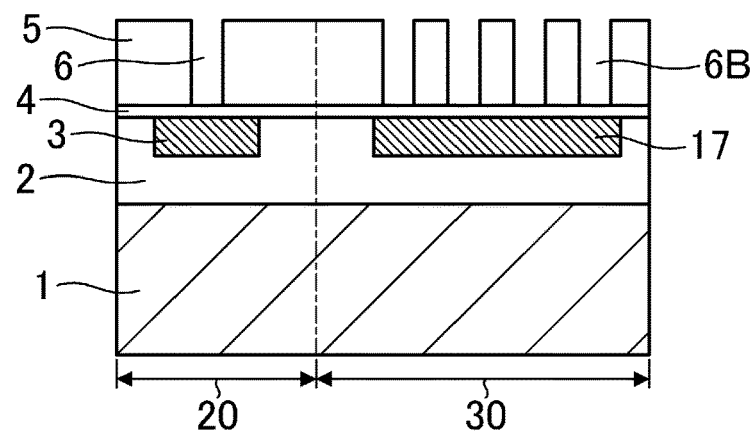
FIG. 11A is a sectional view for describing the method for manufacturing a semiconductor device according to another embodiment.

As illustrated in FIG. 11A, a metal film 17 is provided at the same depth position as that of a first metal wiring line 3 in the pad formation region 30. A first liner film 4 is formed on the first metal wiring line 3, the metal film 17, and a first interlayer film 2. Subsequently, after a second interlayer film 5 has been formed on the first liner film 4, a via hole 6 is formed in the element formation region 20, and the via hole 6B is formed in the pad formation region 30. The diameters of the via hole 6 and the via hole 6B described herein are the same as each other.

Figure 11B:
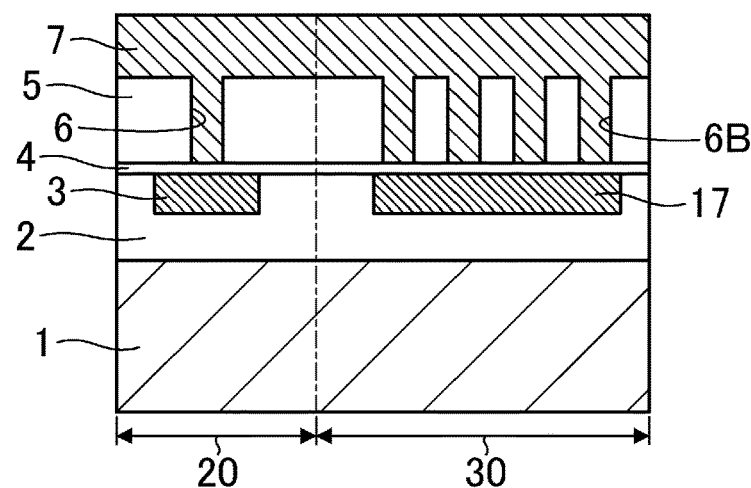
FIG. 11B is a sectional view for describing the method for manufacturing the semiconductor device according to another embodiment.
Figure 11C:
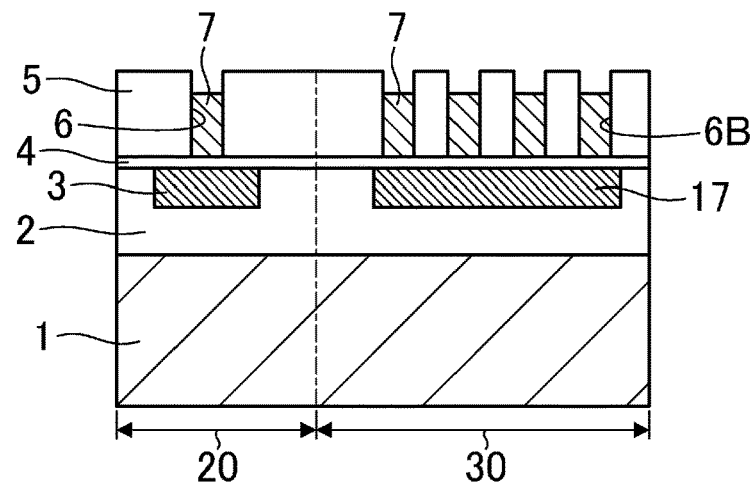
FIG. 11C is a sectional view for describing the method for manufacturing the semiconductor device according to another embodiment.

Next, as illustrated in FIG. 11B, a resist 7 is formed on a substrate. At this step, the via holes 6, 6B are filled with the resist 7. Subsequently, as illustrated in FIG. 11C, the resist 7 is etched back such that the resist 7 partially remains in the via holes 6, 6B.

Figure 12A:
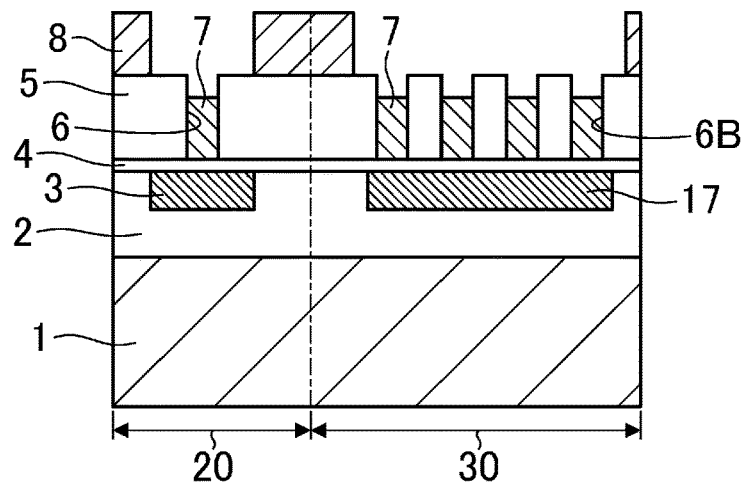
FIG. 12A is a sectional view for describing the method for manufacturing the semiconductor device according to another embodiment.

Subsequently, as illustrated in FIG. 12A, a resist 8 for forming a wiring groove is formed on the second interlayer film 5. In this state, an opening is formed in a region of the resist 8 provided with the via hole 6B.

Figure 12B:
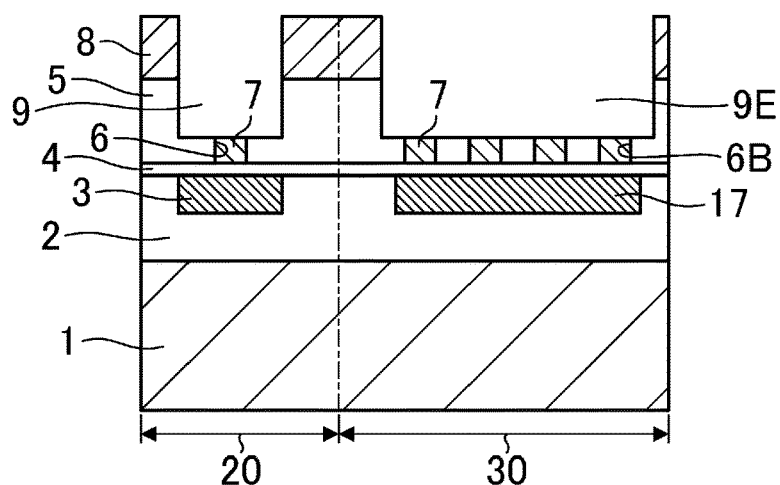
FIG. 12B is a sectional view for describing the method for manufacturing the semiconductor device according to another embodiment.

Next, as illustrated in FIG. 12B, the second interlayer film 5 is etched using the resist 8 as a mask, and in this manner, a wiring groove 9 is formed. The resist 7 remains in the via hole 6B, and therefore, the metal film 17 is not exposed at this step. By this step, a pad hole 9E is formed in the pad formation region 30.

Figure 12C:
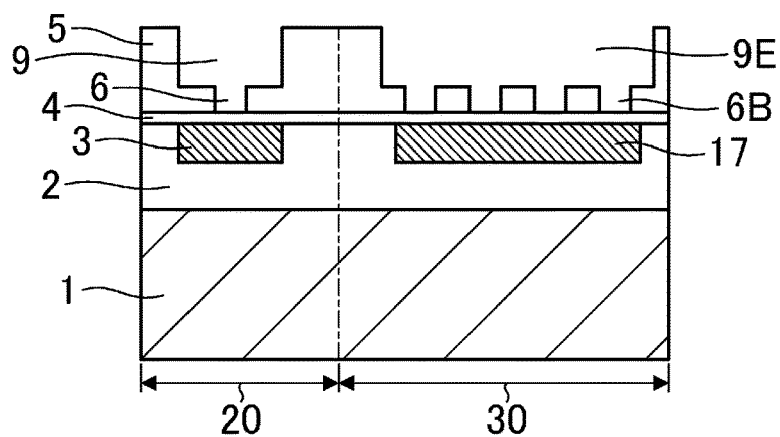
FIG. 12C is a sectional view for describing the method for manufacturing the semiconductor device according to another embodiment.
Figure 13A:
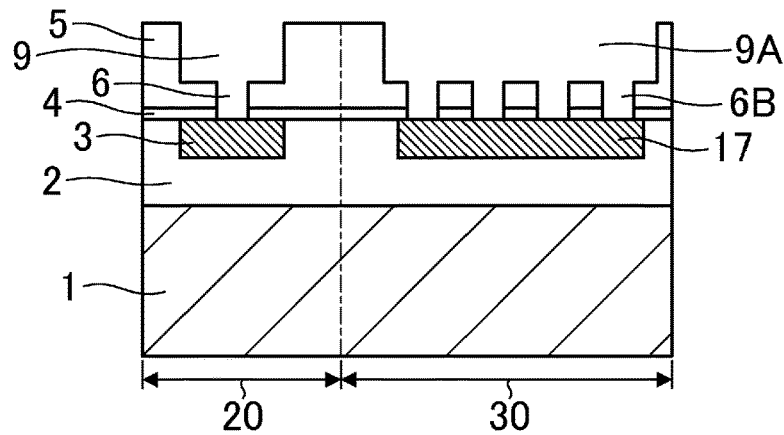
FIG. 13A is a sectional view for describing the method for manufacturing the semiconductor device according to another embodiment.
Figure 13B:
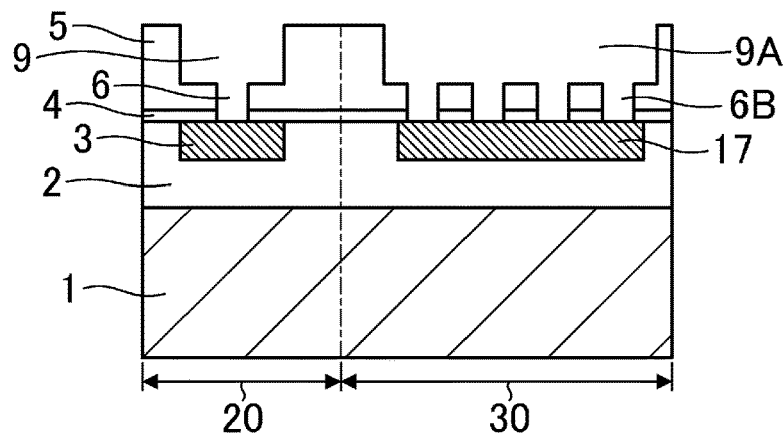
FIG. 13B is a sectional view for describing the method for manufacturing the semiconductor device according to another embodiment.

Subsequently, as illustrated in FIG. 12C, the resists 7, 8 are removed by cleansing. Subsequently, as illustrated in FIG. 13A, an exposed portion of the first liner film 4 is removed by etching in the element formation region 20 and the pad formation region 30. Subsequently, as illustrated in FIG. 13B, the substrate is cleansed. At the step illustrated in FIG. 13A, the same thickness of the first liner film 4 is removed from the element formation region 20 and the pad formation region 30, and therefore, the metal film 17 is less affected by etching. Thus, at the step illustrated in FIG. 13B, a defect is less caused in the metal film 17.

Figure 13C:
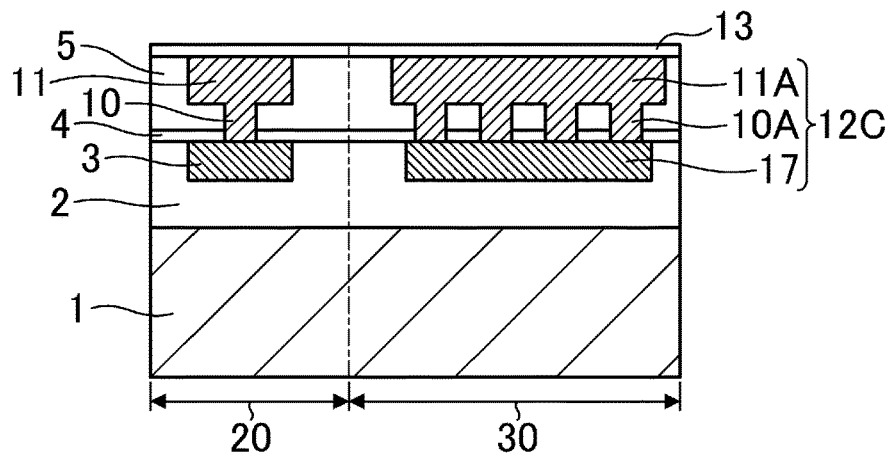
FIG. 13C is a sectional view for describing the method for manufacturing the semiconductor device according to another embodiment.

Next, as illustrated in FIG. 13C, after the via holes 6, 6B, the wiring groove 9, and the pad hole 9E have been filled with copper by a plating method, extra copper is removed by a CMP method. In this manner, a first via 10, a second metal wiring line 11, a third via 10A, and a metal film 11A are formed. In this state, the metal film 17, the third via 10A, and the metal film 11A form a landing pad 12C. Thereafter, a second liner film 13 having a thickness of 60 nm and made of silicon carbide is formed on the second interlayer film 5, the second metal wiring line 11, and the landing pad 12C.

Figure 14A:
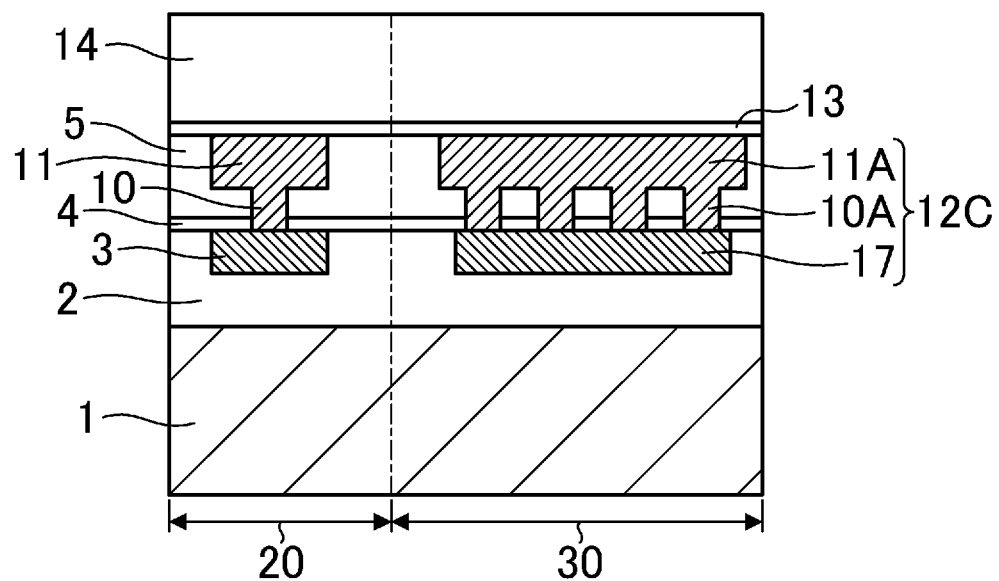
FIG. 14A is a sectional view for describing the method for manufacturing the semiconductor device according to another embodiment.
Figure 14B:
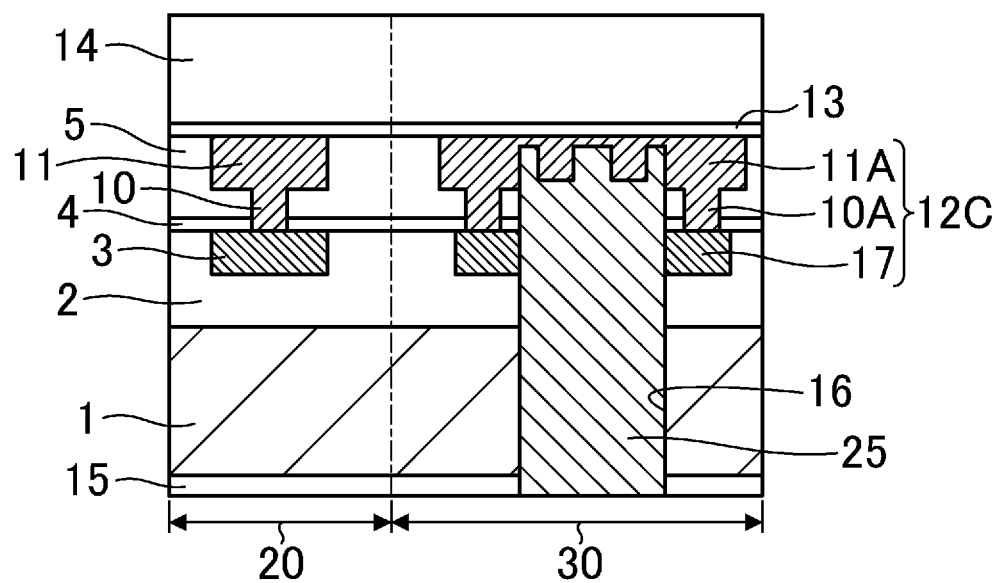
FIG. 14B is a sectional view for describing the method for manufacturing the semiconductor device according to another embodiment.

Next, as illustrated in FIG. 14A, a passivation film 14 made of silicon nitride and having a thickness of 1000 nm is formed by a well-known CVD method etc. on the second liner film 13. Subsequently, as illustrated in FIG. 14B, the substrate 1 is shaved down from a back side such that the thickness of the substrate 1 reaches about 300 to 400 µm. Subsequently, an insulating film 15 and the substrate 1 are etched from the back side by lithograph and an etching method. In this state, the first liner film 4 and part of the second interlayer film 5 are removed, and etching is performed until reaching part of the landing pad 12C. In this manner, a via hole 16 is formed. Subsequently, after the via hole 16 has been filled with copper by the well-known plating method etc., extra copper is removed by CMP. In this manner, a TSV (a second via) 25 penetrating the substrate 1 and connected to the landing pad 12C is formed.

By the method of the present embodiment, no defect is caused in the landing pad 12C. Thus, connection failure between the landing pad 12C and the TSV 25 can be reduced.

Note that according to the method of the present embodiment, the via hole 6B is present between the first liner film 4 and the second interlayer film 5 in the pad formation region 30, and therefore, etching is less reliably stopped on the landing pad 12C upon formation of the via hole 16.

For this reason, it is not preferable that a via with a small diameter is formed in the pad formation region 30. Thus, in the pad formation region 30, a via with a larger diameter than that of the first via 10 in the element formation region 20 is preferably formed in the pad formation region 30.

Note that the semiconductor devices and the methods for manufacturing these devices as described above are example embodiments, and the configuration of the semiconductor device and the thickness, size, material, etc. of each layer can be changed as necessary. For example, the size of the opening of the resist 8 in the pad formation region 30 may be larger than that of the pad hole 6A, but may be equal to or smaller than that of the pad hole 6A.

The semiconductor device and the method for manufacturing such a device according to the present disclosure are applicable to various semiconductor devices provided with a TSV structure.

What is claimed is:

1. A semiconductor device comprising:
a substrate provided with a first region and a second region;
a first interlayer film formed on an upper surface of the substrate;
a first metal wiring line embedded in an upper portion of the first interlayer film in the first region;
a second interlayer film formed on the first interlayer film and the first metal wiring line;
a second metal wiring line embedded in an upper portion of the second interlayer film in the first region;
a first via penetrating the second interlayer film and electrically connecting the first metal wiring line and the second metal wiring line;
a landing pad embedded in the upper portion of the first interlayer film and penetrating the second interlayer film in the second region; and
a second via penetrating the substrate and the first interlayer film from a back side of the substrate and connected to the landing pad in the second region,
wherein a lower surface position of the landing pad is different from that of the first metal wiring line.

2. The semiconductor device according to claim 1, wherein
the first via and the second metal wiring line are made of an identical material, and
the landing pad has a metal film provided from the upper portion of the first interlayer film to an inside of the second interlayer film and made of an identical material to those of the first via and the second metal wiring line.

3. The semiconductor device according to claim 1, wherein
the lower surface position of the landing pad is lower than that of the first metal wiring line, and
a thickness of the landing pad is thicker than a sum of a height of the first metal wiring line, a height of the first via, and a height of the second metal wiring line.

4. A method for manufacturing a semiconductor device, comprising:
a step of forming a first interlayer film formed on an upper surface of a substrate provided with a first region and a second region and a first metal wiring line embedded in an upper portion of the first interlayer film;
a step of forming a second interlayer film formed on the first interlayer film and the first metal wiring line;
a step of forming, in the first region, a wiring groove in the second interlayer film and a first via hole penetrating the second interlayer film above the first metal wiring line;
a step of forming, in the second region, a pad recessed portion at the upper portion of the first interlayer film and forming a pad hole penetrating the second interlayer film upon formation of the wiring groove and the first via hole;
a step of filling the first via hole, the wiring groove, the pad recessed portion, and the pad hole with metal to form a first via in the first via hole, form a second metal wiring line in the wiring groove, and form a landing pad in the pad recessed portion and the pad hole; and
a step of forming, in the second region, a second via penetrating the substrate and the first interlayer film from a back side of the substrate and connected to the landing pad.

5. The semiconductor device manufacturing method according to claim 4, wherein
the pad hole is formed in parallel with formation of the first via hole, and
at least part of the pad recessed portion is formed in parallel with formation of the wiring groove.

6. The semiconductor device manufacturing method according to claim 4, further comprising:
a step of forming a liner film made of an insulator on the first metal wiring line and the first interlayer film before the step of forming the second interlayer film and after the step of forming the first metal wiring line,
wherein the pad hole is formed in parallel with formation of the first via hole, and
the pad recessed portion is formed in the second region in parallel with removal of a portion of the liner film exposed through the first via hole.

7. The semiconductor device manufacturing method according to claim 4, wherein
a lower surface height of the first metal wiring line and a lower surface height of the landing pad are different from each other.

8. The semiconductor device manufacturing method according to claim 4, wherein at the step of forming the first via hole, a third via having a larger diameter than that of the first via is formed at the second interlayer film in the second region.

\* \* \* \* \*